United States Patent
Chi et al.

(10) Patent No.: US 10,541,647 B2
(45) Date of Patent: Jan. 21, 2020

(54) TRANSCONDUCTANCE ($G_m$) CELL BASED ANALOG AND/OR DIGITAL CIRCUITRY

(71) Applicant: Avago Technologies International Sales Pte. Limited, Singapore (SG)

(72) Inventors: Howard Chi, Palo Alto, CA (US); Seema B. Anand, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 97 days.

(21) Appl. No.: 15/702,144

(22) Filed: Sep. 12, 2017

(65) Prior Publication Data
US 2018/0076767 A1    Mar. 15, 2018

Related U.S. Application Data

(60) Provisional application No. 62/393,554, filed on Sep. 12, 2016.

(51) Int. Cl.
*G05F 1/575* (2006.01)
*H03B 5/12* (2006.01)
(Continued)

(52) U.S. Cl.
CPC ............. *H03B 5/1212* (2013.01); *H03L 1/00* (2013.01); *H03L 5/00* (2013.01)

(58) Field of Classification Search
CPC ... H03L 5/00; G05F 1/461; G05F 1/56; G05F 1/561; G05F 1/565; G05F 1/575; G05F 3/26
See application file for complete search history.

(56) References Cited

U.S. PATENT DOCUMENTS 5,563,501 A * 10/1996 Chan .................... G05F 1/565
                                                                     323/273
2006/0164053 A1 * 7/2006 Walter .................. G05F 1/575
                                                                     323/282

(Continued)

*Primary Examiner* — Gary L Laxton
(74) *Attorney, Agent, or Firm* — Sterne, Kessler, Goldstein & Fox P.L.L.C.

(57) ABSTRACT

Transconductance ($g_m$)-cell based circuitry is well suited for low power, low voltage complementary metal oxide silicon (CMOS) design in deep sub micro technology. This circuitry includes a $g_m$ cell as the basic building block. As such, it is desirable to have the transconductance of the $g_m$ cell to be constant against temperature and process corners. The present disclosure describes various $g_m$-cell based circuitry having a controllable transconductance. Preferably, the controllable transconductance can be selectively controlled to be equal to the inverse of the value of an on-chip resistor. For example, the $g_m$-cell based circuitry can sense the transconductance of an internal replica unit and can use negative feedback circuitry to cause this transconductance to be approximately equal a value of an on-chip resistor. However, in some situations, a value of this on-chip resistor is not accurately controlled. Therefore, the present disclosure also discloses a manner of calibrating the $g_m$-cell based circuitry against an external resistor with a known accurate value.

18 Claims, 5 Drawing Sheets

(51) Int. Cl.
*H03L 5/00* (2006.01)
*H03L 1/00* (2006.01)

(56) References Cited

U.S. PATENT DOCUMENTS

| | | | |
|---|---|---|---|
| 2007/0182399 A1* | 8/2007 | Enjalbert | G05F 1/575 323/315 |
| 2009/0200999 A1* | 8/2009 | Lou | G05F 1/575 323/280 |
| 2010/0066320 A1* | 3/2010 | Dasgupta | G05F 1/56 323/273 |

* cited by examiner

TRANSCONDUCTANCE ($G_m$) CELL BASED ANALOG AND/OR DIGITAL CIRCUITRY

CROSS-REFERENCE TO RELATED APPLICATIONS

The present application claims the benefit of U.S. Provisional Patent Appl. No. 62/393,554, filed Sep. 12, 2016, which is incorporated herein by reference in its entirety.

BACKGROUND

Related Art

Transconductance ($g_m$) represents an electrical characteristic for an analog or digital circuit relating to a current provided at an output of the analog or digital circuit to a voltage across an input of the analog or digital circuit. The transconductance for the analog or digital circuit is often expressed in siemens, namely, amperes per volts.

BRIEF DESCRIPTION OF THE DRAWINGS/FIGURES

Embodiments of the disclosure are described with reference to the accompanying drawings. In the drawings, like reference numbers indicate identical or functionally similar elements. Additionally, the left most digit(s) of a reference number identifies the drawing in which the reference number first appears. In the accompanying drawings.

Figure 1:
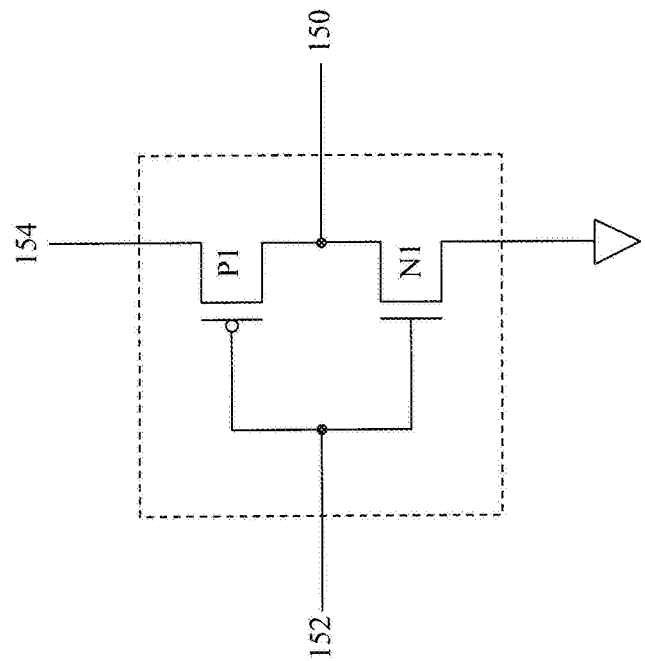
FIG. 1 illustrates an exemplary transconductance ($g_m$) cell according to an embodiment of the present disclosure.

The disclosure will now be described with reference to the accompanying drawings. In the drawings, like reference numbers generally indicate identical, functionally similar, and/or structurally similar elements. The drawing in which an element first appears is indicated by the leftmost digits) in the reference number.

DETAILED DESCRIPTION OF THE DISCLOSURE

Overview

Transconductance ($g_m$)-cell based circuitry is well suited for low power, low voltage complementary metal oxide silicon (CMOS) design in deep sub micro technology. This circuitry includes a $g_m$ cell as the basic building block. As such, it is desirable to have the transconductance of the $g_m$ cell to be constant against temperature and process corners. The present disclosure describes various $g_m$-cell based circuitry having a controllable transconductance. Preferably, the controllable transconductance can be selectively controlled to be equal to the inverse of the value of an on-chip resistor. For example, the $g_m$-cell based circuitry can sense the transconductance of an internal replica unit and can use negative feedback circuitry to cause this transconductance to be approximately equal a value of an on chip resistor. However, in some situations, a value of this on-chip resistor is not accurately controlled. Therefore, the present disclosure also discloses a manner of calibrating the $g_m$-cell based circuitry against an external resistor with a known accurate value.

Exemplary Transconductance ($G_M$) Cell

FIG. 1 illustrates an exemplary transconductance ($g_m$) cell according to an embodiment of the present disclosure. A $g_m$-cell 100 can form the basic building block for various analog and/or digital circuitry, such as a $g_m$-cell based low-drop out (LDO) regulator, a $g_m$-cell based filter, a $g_m$-cell based analog-to-digital converter (ADC), and/or a $g_m$-cell based oscillator to provide some examples. In the exemplary embodiments to be described in further detail below, the $g_m$-cell 100 can be implemented as part of negative feedback circuitry within this analog and/or digital circuitry. Generally, the $g_m$ of the $g_m$-cell 100 represents an electrical characteristic of the $g_m$-cell 100 relating to an output current ($i_{OUT}$) of an output signal 150 and input voltage ($V_{IN}$) of an input signal 152. In the exemplary embodiment illustrated in FIG. 1, this electrical characteristic can be denoted as:

$$g_m = \frac{i_{150}}{V_{152}}, \quad (1)$$

where $g_m$ represents the transconductance of the $g_m$-cell 100, $i_{150}$ represents the output current of the output signal 150, and $V_{152}$ represents the input voltage ($V_{IN}$) of an input signal 152.

Moreover, as illustrated in FIG. 1, the $g_m$-cell 100 receives a biasing voltage 154. The negative feedback circuitry within the analog and/or digital circuitry to be described in further detail below, adjusts the biasing voltage 154 to cause the transconductance of the $g_m$-cell 100 to be approximately inversely proportional to a value of a variable resistor within the analog and/or digital circuitry. For example, this negative feedback circuitry can increase and/or decrease the biasing voltage 154 to proportionally increase and/or decrease the transconductance of the $g_m$-cell 100 to be approximately inversely proportional to the value of the variable resistor.

As further illustrated in FIG. 1, the $g_m$-cell 100 includes a p-type semiconductor device (P1) and a n-type semiconductor device (N1) configured and arranged to form a logical inverting circuit. The logical inverting circuit represents the simplest implementation for the $g_m$-cell 100. However, those skilled in the relevant art(s) will recognize more complex implementations are possible without departing from the spirit and scope of the present disclosure. These complex implementations include various other topologies having various transistors configured and arranged to form various push-pull structures.

Exemplary Transconductance ($G_M$) Cell Based Circuitry

Figure 2:
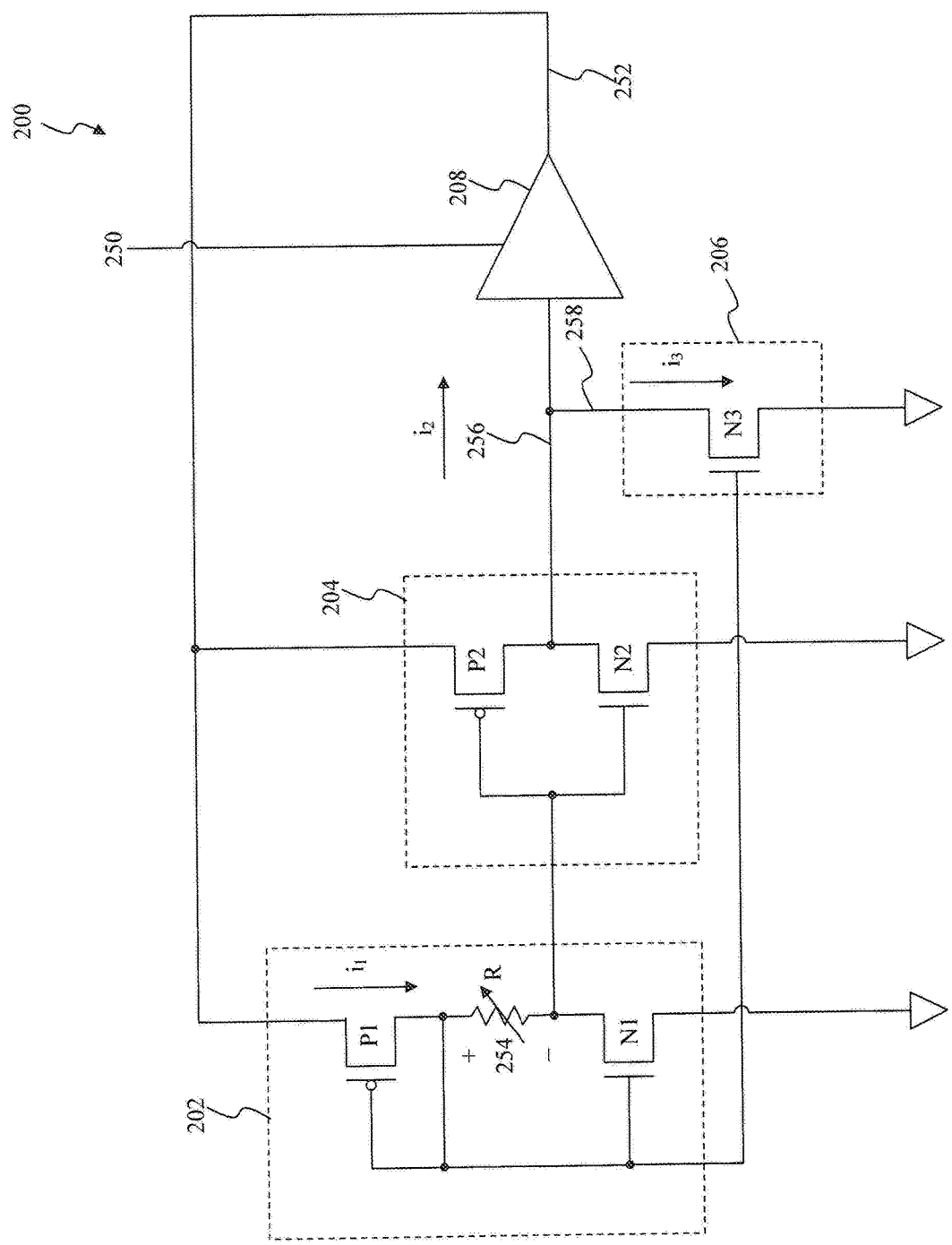
FIG. 2 illustrates an exemplary $g_m$-cell based low-drop out (LDO) regulator having the $g_m$-cell according to an embodiment of the present disclosure.

FIG. 2 illustrates an exemplary $g_m$-cell based low-drop out (LDO) regulator having the $g_m$-cell according to an embodiment of the present disclosure. A $g_m$-cell based low dropout regulator (LDO) 200 can be characterized as having a transconductance which can be selectively controlled to cause the transconductance to be substantially constant against temperature and process corners. In the exemplary embodiment illustrated in FIG. 2, the $g_m$-cell based LDO 200 regulates an input signal 250, such as approximately 2.22V to provide an example, based on the transconductance to provide an output voltage 252. In an exemplary embodiment, the transconductance can be selectively controlled to be equal to the inverse of the value of a variable resistor. In this exemplary embodiment, the $g_m$-cell based LDO 200 can sense the transconductance of a $g_m$-cell, such as the $g_m$-cell 100 to provide an example, and can use negative feedback circuitry to cause the transconductance of the $g_m$-cell to be approximately inversely proportional to the value of a variable resistor. The $g_m$-cell based LDO 200 includes voltage differential circuitry 202, a $g_m$-cell 204, current mirror circuitry 206, and amplifier circuitry 208. The $g_m$-cell 204 can represent an exemplary embodiment of the $g_m$-cell 100 as described above in FIG. 1.

As illustrated in FIG. 2, the negative feedback circuitry of the $g_m$-cell based LDO 200 provides the output voltage 252 from the amplifier circuitry 208 to the voltage differential circuitry 202 and the $g_m$-cell 204. The voltage differential circuitry 202 derives current from the output voltage 252 and provides a differential voltage 254 across a variable resistor R. In the exemplary embodiment illustrated in FIG. 2, the variable resistor R is coupled between a p-type semiconductor device (P1) and an n-type semiconductor device (N1). In an exemplary embodiment, a value of the variable resistor R can be controlled by a digital code. In another exemplary embodiment, the $g_m$-cell based LDO 200 can be fabricated onto a semiconductor substrate using a semiconductor fabrication technique, referred to as being "on-chip." In this exemplary embodiment, the variable resistor R can be situated within the semiconductor substrate, referred to as being an "on-chip" resistor.

In the exemplary embodiment illustrated in FIG. 2, the transconductance of the $g_m$-cell 204 can be characterized as being functionally related a transconductance of a p-type semiconductor device P2 and a transconductance of a n-type semiconductor device N2. As illustrated in FIG. 2, the p-type semiconductor device and the n-type semiconductor device are configured and arranged to form a logical inverting circuit in a substantially similar manner as the $g_m$-cell 100 as described above in FIG. 1. However, those skilled in the relevant art(s) will recognize more complex implementations are possible for the $g_m$-cell 204 without departing from the spirit and scope of the present disclosure. These complex implementations include various other topologies having various transistors configured and arranged to form various push-pull structures. As illustrated in FIG. 2, the $g_m$-cell 204 receives the output voltage 252 as a biasing voltage and amplifies the differential voltage 254 utilizing the biasing voltage in accordance with its transconductance to provide an output current 256. The output current 256 can be represented as:

$$i_2 = g_m * R * i_1, \quad (2)$$

where $i_2$ represents the output current 256, $g_m$ represents the transconductance of the $g_m$-cell 204, R represents the value of the variable resistor R, and $i_1$ represents current flowing through the p-type semiconductor device P1 and the n-type semiconductor device N1 of the voltage differential circuitry 202.

The current mirror circuitry 206 effectively senses the current of the voltage differential circuitry 202 through a current mirroring mechanism. In the exemplary embodiment illustrated in FIG. 2, the current mirror circuitry 206 effectively mirrors the current $i_1$ flowing through the p-type semiconductor device P1 and the n-type semiconductor device N1 of the voltage differential circuitry 202 to provide a sensed current 258. As illustrated in FIG. 2, the current mirror circuitry 206 includes a n-type semiconductor device N3 to mirror the current $i_1$ flowing through the p-type semiconductor device P1 and the n-type semiconductor device N1. In the exemplary embodiment illustrated in FIG. 2, the sensed current 258 can be represented as:

$$i_3 = \frac{i_1}{N}, \quad (3)$$

where $i_3$ represents the sensed current 258, $i_1$ represents the output current 256, and N represents a size of the n-type semiconductor device N3. And in the exemplary embodiment illustrated in FIG. 2, the negative feedback circuitry of the $g_m$-cell based LDO 200 substantially maintains the output current 256, namely, the current $i_2$ as illustrated in FIG. 2, to be approximately equal to the sensed current 258 namely, the current $i_3$ as illustrated in FIG. 2.

In the exemplary embodiment illustrated in FIG. 2, the negative feedback circuitry of the $g_m$-cell based LDO 200 includes the amplifier circuitry 208 to cause the output current 256, namely, the current $i_2$ as illustrated in FIG. 2, to be approximately equal to the sensed current 258 namely, the current $i_3$ as illustrated in FIG. 2, through the negative feedback circuitry of the output current of the output voltage 252. In this situation, when the current $i_2$ is approximately equal to the current $i_3$, the transconductance of the $g_m$-cell based LDO 200 can be denoted as:

$$g_m = \frac{1}{N * R}, \quad (4)$$

where $g_m$ represents the transconductance of the $g_m$-cell based LDO 200, N represents the size of the n-type semiconductor device N3, and R represents the value of the variable resistor R. In an exemplary embodiment, the value of the variable resistor R can be adjusted to increase and/or decrease the transconductance of the $g_m$-cell based LDO 200.

Figure 3:
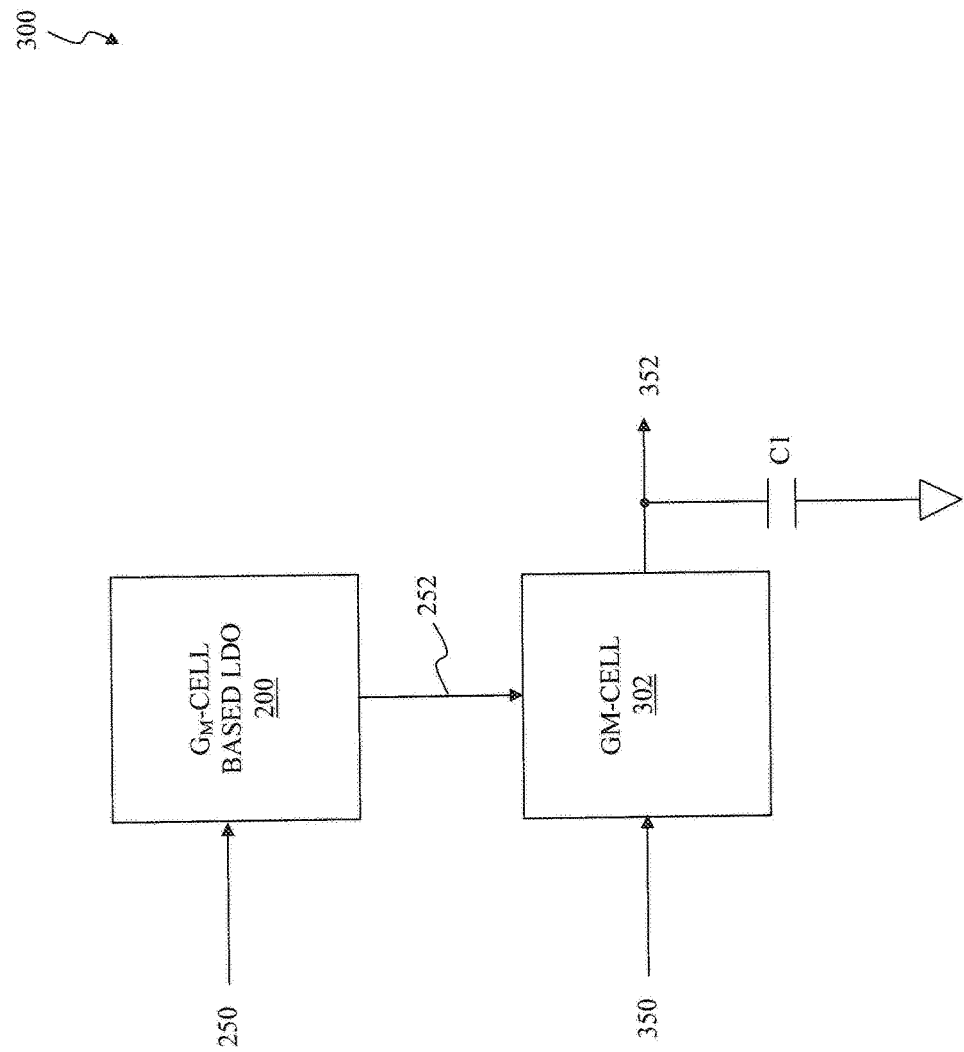
FIG. 3 illustrates an exemplary $g_m$-C based integrator having the $g_m$-cell according to an embodiment of the present disclosure.

FIG. 3 illustrates an exemplary $g_m$-C based integrator having the $g_m$-cell according to an embodiment of the present disclosure. As illustrated in FIG. 3, the $g_m$-cell based LDO 200, as described above in FIG. 2, can be supplemented with circuitry to form a $g_m$-cell based integrator 300. In the exemplary embodiment illustrated in FIG. 3, the $g_m$-cell based LDO 200 as described above in FIG. 2 can be supplemented with a $g_m$-cell 302 and a capacitor C1 to form the $g_m$-cell based integrator 300. In the exemplary embodiment illustrated in FIG. 3, the $g_m$-cell 302 can be implemented in a substantially similar manner as the $g_m$-cell 204 as described above in FIG. 2. However, those skilled in the relevant art(s) will recognize different implementations, some of which can be more complex than the $g_m$-cell 204 as illustrated in FIG. 2, are possible without departing from the spirit and scope of the present disclosure.

The $g_m$-cell 302 advantageously provides a constant, or substantially constant, transconductance against temperature and process corners. In the exemplary embodiment illustrated in FIG. 3, the $g_m$-C based integrator 300 performs a first-order low pass filtering of an analog input signal 350 to provide an analog output signal 352. As illustrated in FIG. 3, the $g_m$-cell 302 receives the output voltage 252 as a biasing voltage from the $g_m$-cell based LDO 200 and amplifies the analog input signal 350 utilizing this biasing voltage in accordance with its transconductance to provide the analog output signal 352 which is thereafter filtered by the capacitor C1.

Figure 4:
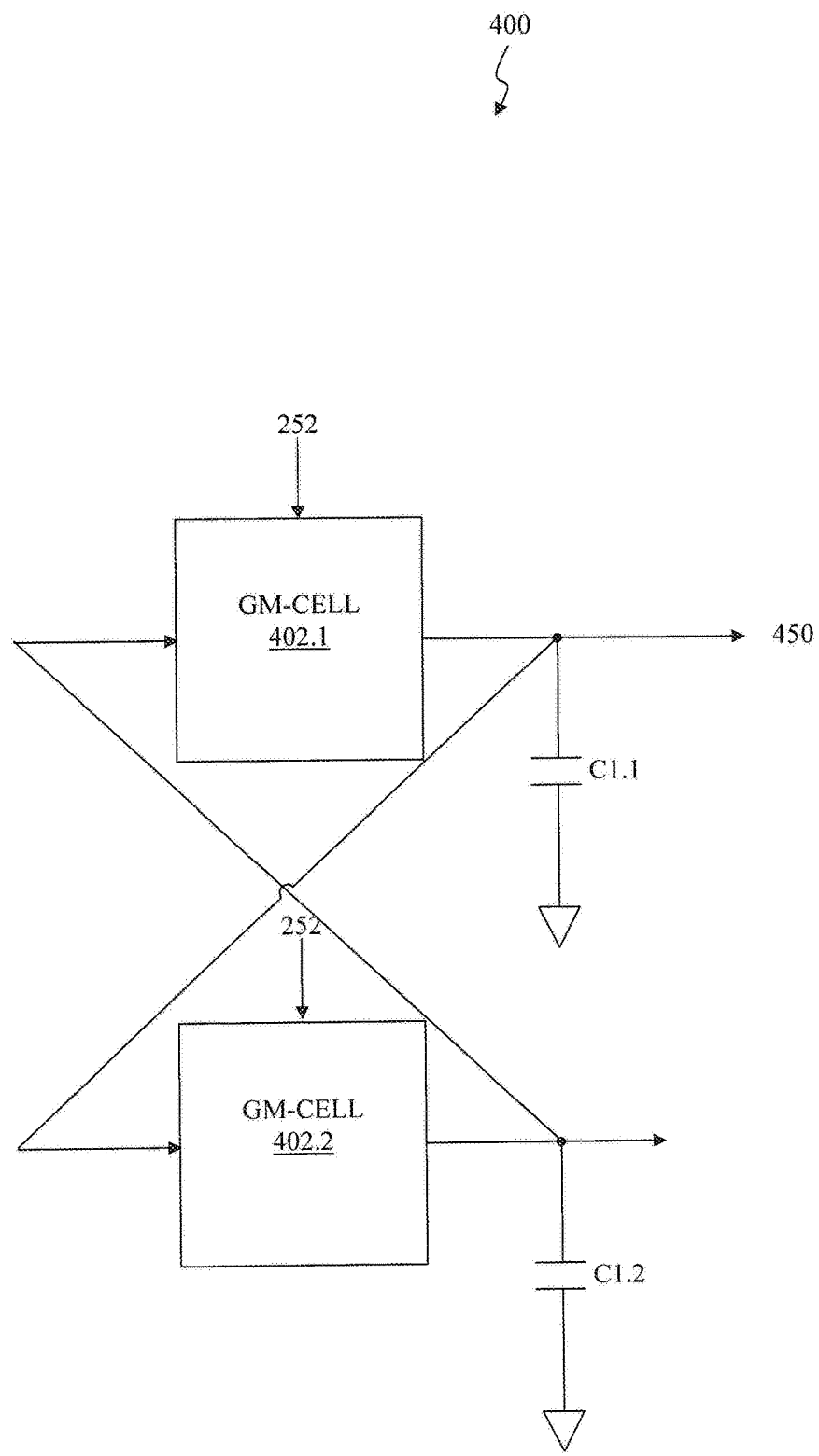
FIG. 4 illustrates an exemplary $g_m$-C based oscillator having the $g_m$-cell according to an embodiment of the present disclosure.

FIG. 4 illustrates an exemplary $g_m$-C based oscillator having the $g_m$-cell according to an embodiment of the present disclosure. As illustrated in FIG. 4, the $g_m$-cell based LDO 200, as described above in FIG. 2, can be supplemented with circuitry to form a $g_m$-C based oscillator 400. For simplicity, the $g_m$-cell based LDO 200 is not illustrated in FIG. 4. In the exemplary embodiment illustrated in FIG. 3, the $g_m$-cell based LDO 200 as described above in FIG. 2 can be supplemented with $g_m$-cells 402.1 and 404.2 and capacitors C1.1 and C1.2 to form the $g_m$-C based oscillator 400. In the exemplary embodiment illustrated in FIG. 3, the $g_m$-cells 402.1 and 404.2 can be implemented in a substantially similar manner as the $g_m$-cell 204 as described above in FIG. 2. However, those skilled in the relevant art(s) will recognize different implementations, some of which can be more complex than the $g_m$-cell 204 as illustrated in FIG. 2, are possible without departing from the spirit and scope of the present disclosure. Moreover, those skilled in the relevant art(s) will also recognize that other exemplary embodiments for the $g_m$-C based oscillator 400 are possible having different numbers of the $g_m$-cells 402 and the capacitors C1 without departing from the spirit and scope of the present disclosure.

The $g_m$-cells 402.1 and 404.2 advantageously provide a constant, or substantially constant, transconductance against temperature and process corners. In the exemplary embodiment illustrated in FIG. 4, the $g_m$-cells 402.1 and 404.2 and capacitors CL1.1 and C1.2 are configured and arranged to form a ring oscillator circuit. In this exemplary embodiment, the $g_m$-cell 402.1 and its associated capacitor C1.1 are cross-coupled to the $g_m$-cell 402.2 and its associated capacitor C1.2, namely, an input of the $g_m$-cell 402.1 is coupled to an output of the $g_m$-cell 402.2 and an input of the $g_m$-cell 402.2 is coupled to an output of the $g_m$-cell 402.1.

Calibration of the Exemplary Transconductance ($G_M$) Cell Based Circuitry

Figure 5:
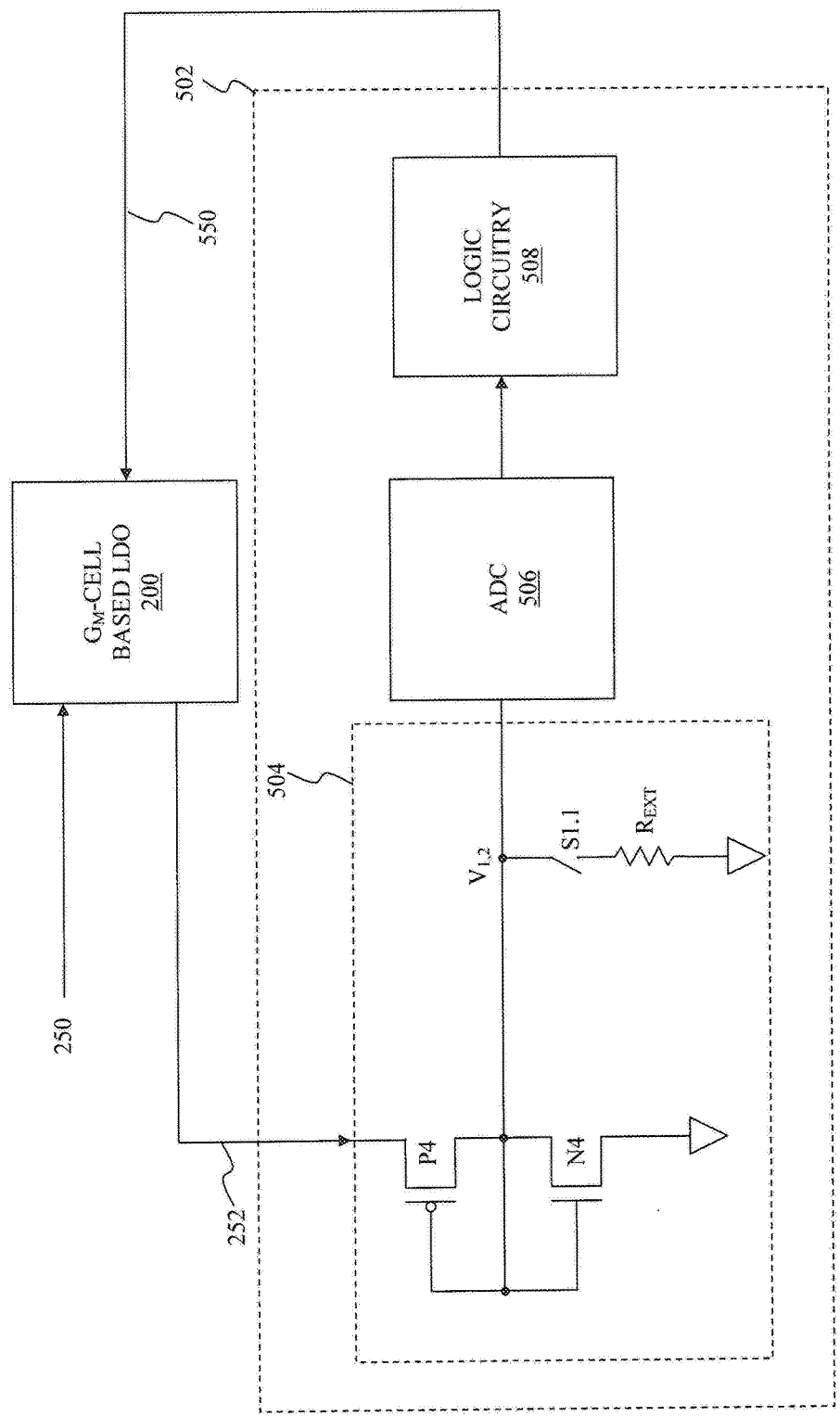
FIG. 5 illustrates exemplary calibration circuitry for calibrating the exemplary $g_m$-cell based LDO regulator based circuitry according to an embodiment of the present disclosure.

FIG. 5 illustrates exemplary calibration circuitry for calibrating the exemplary $g_m$-cell based LDO regulator based circuitry according to an embodiment of the present disclosure. As discussed above, in FIG. 2, the $g_m$-cell based LDO 200 includes the variable resistor R which can be implemented "on-chip." In some situations, this "on-chip" implemented of the variable resistor R cannot accurately be controlled during fabrication. In these situations, the $g_m$-cell based LDO 200 can be calibrated using an external resistor with a known accurate value and this calibration can be used to determine the value of the variable resistor R. As illustrated in FIG. 5, calibration circuitry 502 includes replica circuitry 504, an analog-to-digital converter (ADC) 506, and logic circuitry 508.

As illustrated in FIG. 5, the calibration circuitry 502 can be used to determine the value of the variable resistor R within the $g_m$-cell based circuitry 500. In the exemplary embodiment illustrated in FIG. 5, the replica circuitry 504 represents a replica of voltage differential circuitry of the $g_m$-cell based LDO 200, such as the voltage differential circuitry 202 to provide an example, having an external resistor R with a known accurate value. As illustrated in FIG. 5, the replica circuitry 504 includes a p-type semiconductor device P4 and n-type semiconductor device N4 configured and arranged to form a logical inverting circuit having its input coupled to its output in a substantially similar manner as the voltage differential circuitry 202 as described above in FIG. 2.

As additionally illustrated in FIG. 5, the replica circuitry 504 is coupled to a switch S1 and an external resistor $R_{EXT}$ having the known accurate resistance. In a first mode of operation, the switch S1 is closed coupling the replica circuitry 504 and the external resistor $R_{EXT}$. The ADC 506 measures a differential voltage, denoted as $V_{1,2}$ in FIG. 5, across the external resistor $R_{EXT}$. Thereafter, the switch S1 is open decoupling the replica circuitry 504 and the external resistor $R_{EXT}$ in a second mode of operation. The ADC 506 measures the differential voltage $V_{1,2}$ across the external resistor $R_{EXT}$.

The logic circuitry 508 determines a transconductance of the replica circuitry 504 having the external resistor $R_{EXT}$. In an exemplary embodiment, the transconductance of the replica circuitry 504 can be calculated as:

$$g_m = \frac{1}{R_{EXT}} * \frac{V_2}{V_1 - V_2}, \qquad (5)$$

where $R_{EXT}$ represents the value of the external resistor $R_{EXT}$, $V_1$ represents the differential voltage in the first mode of operation of the calibration circuitry 200, and $V_2$ represents the differential voltage in the second mode of operation. Thereafter, the logic circuitry 508 compares the determined transconductance of the replica circuitry 504 with a desired transconductance for the $g_m$-cell based circuitry 500. In some situations, the logic circuitry 508 adjusts a resistance code 550 provided to the variable resistor R within the $g_m$-cell based circuitry 500 to adjust the differential voltage. The logic circuitry 508 continues to iteratively adjust the resistance code 550, switching between in the first mode of operation and the second mode of operation, until the determined transconductance of the replica circuitry 504 is approximately equal to the desired transconductance for the $g_m$-cell based circuitry 500.

CONCLUSION

The Detailed Description referred to accompanying figures to illustrate exemplary embodiments consistent with the disclosure. References in the disclosure to "an exemplary embodiment" indicates that the exemplary embodiment described include a particular feature, structure, or characteristic, but every exemplary embodiment can not necessarily include the particular feature, structure, or characteristic. Moreover, such phrases are not necessarily referring to the same exemplary embodiment. Further, any feature, structure, or characteristic described in connection with an exemplary embodiment can be included, independently or in any combination, with features, structures, or characteristics of other exemplary embodiments whether or not explicitly described.

The exemplary embodiments described within the disclosure have been provided for illustrative purposes, and are not intend to be limiting. Other exemplary embodiments are possible, and modifications can be made to the exemplary embodiments while remaining within the spirit and scope of the disclosure. The disclosure has been described with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Detailed Description of the exemplary embodiments fully revealed the general nature of the disclosure that others can, by applying knowledge of those skilled in relevant art(s), readily modify and/or adapt for various applications such exemplary embodiments, without undue experimentation, without departing from the spirit and scope of the disclosure. Therefore, such adaptations and modifications are intended to be within the meaning and plurality of equivalents of the exemplary embodiments based on the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

What is claimed is:

1. A transconductance ($g_m$)-cell based low-drop out (LDO) regulator for regulating an input voltage to provide an output voltage, comprising:
   voltage differential circuitry configured to provide a differential voltage based on the output voltage;
   a $g_m$-cell configured to amplify the differential voltage in accordance with a transconductance to provide an output current, wherein the transconductance is a ratio of the output current and the differential voltage;
   current mirror circuitry configured to mirror current flowing through the voltage differential circuitry to provide a sensed current; and
   amplifier circuitry configured to provide the output voltage which causes the output current to be approximately equal to the sensed current.

2. The $g_m$-cell based LDO regulator of claim 1, wherein the voltage differential circuitry comprises:
   a variable resistor configured to convert the current flowing through the voltage differential circuitry to the differential voltage.

3. The $g_m$-cell based LDO regulator of claim 2, wherein the $g_m$-cell based LDO regulator is fabricated onto a semiconductor substrate, and
   wherein the variable resistor is situated within the semiconductor substrate.

4. The $g_m$-cell based LDO regulator of claim 2, wherein the voltage differential circuitry further comprises:
   a p-type semiconductor device; and
   an n-type semiconductor device,
   wherein the variable resistor is coupled between the p-type semiconductor device and the n-type semiconductor device,
   wherein the current flowing through the voltage differential circuitry flows through the p-type semiconductor device, the n-type semiconductor device, and the variable resistor.

5. The $g_m$-cell based LDO regulator of claim 2, wherein the transconductance is inversely related to a value of the variable resistor.

6. The $g_m$-cell based LDO regulator of claim 1, wherein the $g_m$-cell comprises:
   a p-type semiconductor device; and
   an n-type semiconductor device,
   wherein the p-type semiconductor device and the n-type semiconductor device are configured and arranged to form a logical inverting circuit.

7. The $g_m$-cell based LDO regulator of claim 2, wherein the voltage differential circuitry is further configured to adjust the differential voltage to cause the transconductance to be inversely proportional to a value of the variable resistor.

8. The $g_m$-cell based LDO regulator of claim 7, wherein the value of the variable resistor is controllable by a digital code.

9. The $g_m$-cell based LDO regulator of claim 2, wherein the voltage differential circuitry is further configured to derive the current flowing through the voltage differential circuitry from the output voltage to provide a differential voltage across the variable resistor.

10. A transconductance ($g_m$)-cell based low-drop out (LDO) regulator for regulating an input voltage to provide an output voltage, comprising: voltage differential circuitry, having a variable resistor, configured to derive a first current flowing through the voltage differential circuitry from the output voltage to provide a differential voltage across the variable resistor; a $g_m$-cell configured to amplify the differential voltage to provide an output current, the output current being related to a transconductance of the $g_m$-cell, a value of the variable resistor, and the first current flowing through the voltage differential circuitry, wherein the voltage differential circuitry is further configured to adjust the differential voltage to cause the transconductance to be inversely proportional to the value of the variable resistor; current mirror circuitry configured to mirror the first current flowing through the voltage differential circuitry to provide a sensed current; and amplifier circuitry configured to provide the output voltage which causes the output current to be approximately equal to the sensed current.

11. The $g_m$-cell based LDO regulator of claim 10, wherein the voltage differential circuitry further comprises:
    a p-type semiconductor device; and
    an n-type semiconductor device,
    wherein the variable resistor is coupled between the p-type semiconductor device and the n-type semiconductor device,
    wherein the first current flowing through the voltage differential circuitry flows through the p-type semiconductor device, the n-type semiconductor device, and the variable resistor.

12. The $g_m$-cell based LDO regulator of claim 10, wherein the transconductance is inversely related to the value of the variable resistor.

13. The $g_m$-cell based LDO regulator of claim 10, wherein the value of the variable resistor is controllable by a digital code.

14. The $g_m$-cell based LDO regulator of claim 10, wherein the $g_m$-cell comprises:
    a p-type semiconductor device; and
    an n-type semiconductor device,
    wherein the p-type semiconductor device and the n-type semiconductor device are configured and arranged to form a logical inverting circuit, and
    wherein a drain of the p-type semiconductor device is configured to receive the output voltage.

15. A method for operating a transconductance ($g_m$)-cell based low-drop out (LDO) regulator for regulating an input voltage to provide an output voltage, the method comprising:
    deriving a first current from the output voltage to provide a differential voltage across a variable resistor;
    amplifying the differential voltage to provide an output current, the output current being related to a transconductance of a $g_m$-cell, a value of the variable resistor, and the first current,
    mirroring the first current to provide a sensed current; and
    providing the output voltage which causes the output current to be approximately equal to the sensed current.

16. The method of claim 15, wherein the first current flows through a p-type semiconductor device, an n-type semiconductor device, and the variable resistor.

17. The method of claim 15, wherein the transconductance is inversely related to the value of the variable resistor.

18. The method of claim 15, wherein the value of the variable resistor is controllable by a digital code.

* * * * *